US011690177B2

(12) United States Patent
Tourne

(10) Patent No.: US 11,690,177 B2
(45) Date of Patent: Jun. 27, 2023

(54) METHODS AND SYSTEMS FOR BACK-DRILLING A MULTI-LAYER CIRCUIT BOARD

(71) Applicant: NextGin Technology BV, Helmond (NL)

(72) Inventor: J.A.A.M. Tourne, Helmond (NL)

(73) Assignee: NextGin Technology BV, Helmond (NL)

( * ) Notice: Subject to any disclaimer, the term of this patent is extended or adjusted under 35 U.S.C. 154(b) by 20 days.

(21) Appl. No.: 17/224,501

(22) Filed: Apr. 7, 2021

(65) Prior Publication Data

US 2021/0315103 A1 Oct. 7, 2021

Related U.S. Application Data

(60) Provisional application No. 63/006,538, filed on Apr. 7, 2020.

(51) Int. Cl.
*H05K 3/00* (2006.01)

(52) U.S. Cl.
CPC ..... *H05K 3/0047* (2013.01); *H05K 2203/163* (2013.01)

(58) Field of Classification Search
CPC ........... H05K 3/0047; H05K 2203/163; H05K 2203/0207; H05K 2203/0242; Y10T 29/49165; Y10T 29/49167
USPC .................................................. 29/852, 853
See application file for complete search history.

(56) References Cited

U.S. PATENT DOCUMENTS

| 3,120,136 A | 2/1964 | Bieker |
| 3,739,461 A | 6/1973 | Cupler |
| 4,543,715 A | 10/1985 | Iadarola et al. |
| 4,644,335 A | 2/1987 | Wen |
| 4,765,784 A | 8/1988 | Karwan |

(Continued)

FOREIGN PATENT DOCUMENTS

| DE | 4340249 A1 | 11/1993 |
| JP | 362264812 A | 11/1987 |

(Continued)

OTHER PUBLICATIONS

International Search Report and Written Opinion (PCT/US/21/26163); dated Jul. 16, 2021; 12 pgs.

*Primary Examiner* — Donghai D Nguyen
(74) *Attorney, Agent, or Firm* — Dunlap Codding, P.C.

(57) ABSTRACT

Methods and systems for making a multi-layer circuit board are disclosed, including electrically connecting a boring device with a plated multi-layered circuit board; cutting a first bore having a first diameter through a first layer of the plated multi-layered circuit board; reciprocally extending a second cutting device a first predetermined distance into a barrel plated multi-layered circuit board and retracting the cutting device a second predetermined distance that is less than the first predetermined distance to form a second bore; after each retraction, sensing for electrical contact indicating a closed circuit between the cutting device and the plated multi-layered circuit board; if a closed circuit is sensed, determining if the second bore has reached an expected depth of a contact layer; and if the expected depth of the contact layer has not been reached, determining that a sliver has been formed in the barrel.

4 Claims, 6 Drawing Sheets

(56) References Cited

U.S. PATENT DOCUMENTS

| | | | |
|---|---|---|---|
| 4,789,770 A | 12/1988 | Kasner et al. | |
| 4,826,370 A | 5/1989 | Conradsson | |
| 4,872,787 A | 10/1989 | Arai et al. | |
| 5,105,175 A | 4/1992 | Kaltenecker | |
| 5,139,376 A | 8/1992 | Pumphrey | |
| 5,154,546 A | 10/1992 | Neumann et al. | |
| 5,191,174 A | 3/1993 | Chang et al. | |
| 5,257,531 A | 11/1993 | Motosugi et al. | |
| 5,301,420 A | 4/1994 | Cho et al. | |
| 5,529,441 A | 6/1996 | Kosmowski et al. | |
| 5,630,272 A | 5/1997 | Wenke | |
| 6,015,249 A | 1/2000 | Sacchetti | |
| 6,257,348 B1 | 7/2001 | Momochi et al. | |
| 6,309,151 B1 | 10/2001 | Sacchetti | |
| 6,372,999 B1 | 4/2002 | Bjorndahl et al. | |
| 6,525,538 B1 | 2/2003 | Mercer | |
| 6,750,403 B2 | 6/2004 | Peterson | |
| 6,839,964 B2 | 1/2005 | Henson | |
| 6,857,828 B2 | 2/2005 | Weber et al. | |
| 9,341,670 B2 * | 5/2016 | Bartley | H05K 3/0047 |
| 9,526,178 B2 * | 12/2016 | Yang | H05K 3/0047 |
| 2005/0128672 A1 | 6/2005 | Tourne et al. | |
| 2012/0176151 A1 | 7/2012 | Sherry et al. | |
| 2014/0093321 A1 | 4/2014 | Liu | |
| 2015/0342057 A1 | 11/2015 | Bartley et al. | |

FOREIGN PATENT DOCUMENTS

| | | | |
|---|---|---|---|
| JP | 06112659 A | 4/1994 | |
| JP | 2000280200 A | 10/2000 | |
| SE | 9003587 A | 11/1990 | |

* cited by examiner

METHODS AND SYSTEMS FOR BACK-DRILLING A MULTI-LAYER CIRCUIT BOARD

INCORPORATION BY REFERENCE

The present application claims priority to a provisional patent application identified by U.S. Ser. No. 63/006,538, filed Apr. 7, 2020, titled "Method for Backdrilling and Sliver Detection", the entire contents of which are hereby incorporated herein by reference.

BACKGROUND

Multilayer circuit boards and/or wiring boards are well known in the art. The multilayer circuit boards are formed with a number of signal layers (conductive layers) which are arranged in a predetermined pattern. The signal layers are insulated from each other by dielectric layers. Thus, the multilayer circuit board is formed from interleaved (e.g., alternating) signal layers and dielectric layers. Holes or "vias" are formed through the multilayer circuit board and may be plated with electrically conductive material to connect one signal layer to another signal layer. When formed, the plated holes typically extend from one main side of the multilayer circuit board to an opposite side of the multilayer circuit board.

In some instances, the plated holes or vias include a "stub portion" which extends away from the signal layer toward one of the sides of the multilayer circuit board. In high-speed data-transmission the stub on a hole causes dispersion or other effects that influence signal integrity and therefore a reduction of bandwidth that can be achieved. Therefore, it is desirable to remove the stub portion to enhance the signal to noise ratio in electronic systems that utilize high-speed signals. The smaller the stub portion the better the signal quality. In the past, the stub portion of the plated holes has been removed using a process referred to as "back drilling." In the back drilling process, the stub portion of the plated hole is removed by drilling the stub portion to a predetermined depth. However, in practice the thicknesses of the various layers in the multilayer circuit boards are not uniform, and the depths of the signal layers within the multilayer circuit boards vary which often changes the amount of the stub portion which needs to be removed. Drilling too deeply will disconnect the signal layer from the plated hole, or leave an unreliable connection; whereas not drilling deep enough decreases the signal to noise ratio caused by the increased stub length.

In addition to the stub length as described in the previous paragraph, chips or slivers of copper may be left behind in the drilled-out copper barrel. When the chip is connected to the copper barrel it will act as a stub and cause the same degree of problems as an incorrectly drilled stub. Chips can be caused by a misalignment of the back-drill hole to the first drilled (plated) hole or by drill wander of the primary drilled hole or the back-drilled hole.

Therefore, a need exists for systems and processes for overcoming the problems associated with the variance in thickness of the layers in the multilayer circuit board to form a reduced stub length as well as detecting slivers. It is to such an improved system and method that the presently disclosed inventive concepts are directed.

BRIEF DESCRIPTION OF THE SEVERAL VIEWS OF THE DRAWINGS

To assist those of ordinary skill in the relevant art in making and using the subject matter hereof, reference is made to the appended drawings, which are not intended to be drawn to scale, and in which like reference numerals are intended to refer to similar elements for consistency. For purposes of clarity, not every component may be labeled in every drawing.

DETAILED DESCRIPTION

Figure 1:
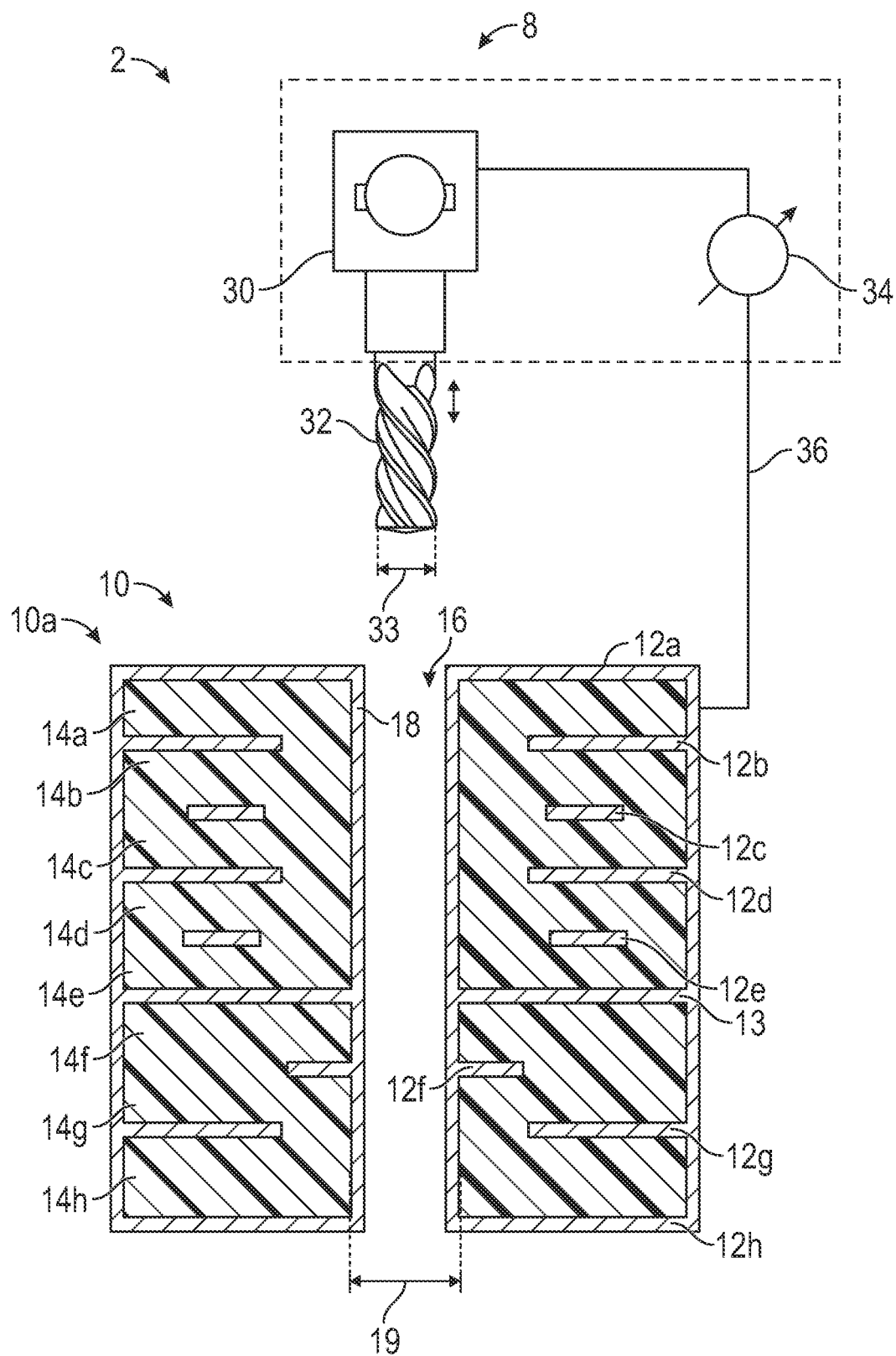
FIG. 1 is a diagrammatic view of a system for back-drilling a plated multi-layered circuit board constructed in accordance with one embodiment of the present disclosure.

Before explaining at least one embodiment of the disclosure in detail, it is to be understood that the disclosure is not limited in its application to the details of construction, experiments, exemplary data, and/or the arrangement of the components set forth in the following description or illustrated in the drawings unless otherwise noted.

The systems and methods as described in the present disclosure are capable of other embodiments or of being practiced or carried out in various ways. Also, it is to be understood that the phraseology and terminology employed herein is for purposes of description, and should not be regarded as limiting.

The following detailed description refers to the accompanying drawings. The same reference numbers in different drawings may identify the same or similar elements.

As used in the description herein, the terms "comprises," "comprising," "includes," "including," "has," "having," or any other variations thereof, are intended to cover a non-exclusive inclusion. For example, unless otherwise noted, a process, method, article, or apparatus that comprises a list of elements is not necessarily limited to only those elements, but may also include other elements not expressly listed or inherent to such process, method, article, or apparatus.

Further, unless expressly stated to the contrary, "or" refers to an inclusive and not to an exclusive "or". For example, a condition A or B is satisfied by one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the inventive concept. This description should be read to include one or more, and the singular also includes the plural unless it is obvious that it is meant otherwise. Further, use of the term "plurality" is meant to convey "more than one" unless expressly stated to the contrary.

As used herein, any reference to "one embodiment," "an embodiment," "some embodiments," "one example," "for example," or "an example" means that a particular element, feature, structure or characteristic described in connection with the embodiment is included in at least one embodiment. The appearance of the phrase "in some embodiments" or "one example" in various places in the specification is not necessarily all referring to the same embodiment, for example.

The presently disclosed inventive concepts includes a combination of multi-layer circuit board design and a progressive reciprocating back drill process with dynamic electrical sensing through a conductive cutting device creating a process that controls a stub length and/or eliminates potential slivers.

Figure 6:
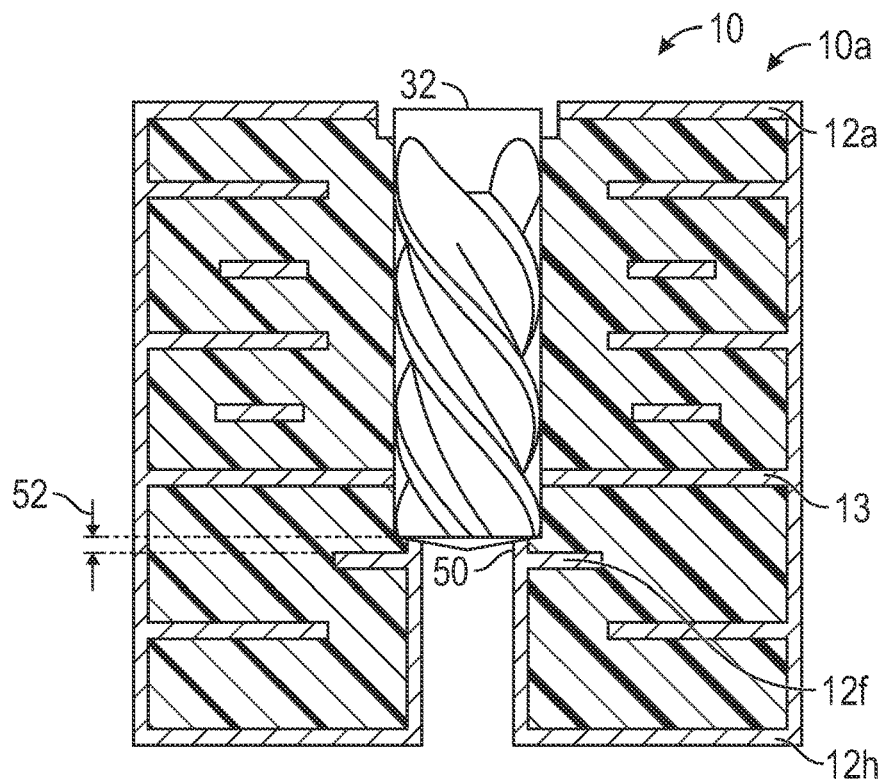
FIG. 6 is a cross sectional view of the plated multi-layer circuit board of FIG. 4 showing the cutting device at a final depth in accordance with one embodiment of the present disclosure.

Referring now to the drawings, and in particular FIGS. 1-6, shown therein is a back-drilling system 2 which is provided with a boring device 4 which is used for cutting or depth-drilling a plated multi-layer circuit board 10 to form a multi-layer circuit board 10a (see FIG. 6).

The plated multi-layer circuit board 10 is provided with signal layers 12a-12h, a contact layer 13, dielectric layers 14a-14h, an aperture 16, and a barrel 18 comprised of electrically conductive plating or material having an outside diameter 19.

The methods described herein may be performed before the outer layers of the plated multi-layer circuit board 10a are etched or removed. In other words, all circuits of the plated multi-layer circuit board 10 are shorted. The aperture 16 may be open and lined with barrel 18 (as illustrated in FIG. 1). In other embodiments, the aperture 16 may be filled with a conductive material or the barrel 18 may be filled with a non-conductive material. Once the back drill process(es) described herein have been performed, excess copper on the surface of the plated multi-layer circuit board 10 may be removed using techniques such as etching, laser ablation, milling, etc.

The methods described herein may use one or more contact layer 13 positioned relative to a desired signal layer 12f as a reference to determine a depth for drilling into the plated multi-layer circuit board 10 to remove portions of the barrel 18. The contact layer 13 is positioned internally in the plated multi-layer circuit board 10 and spaced a known distance from a signal layer of interest (signal layer 12f is used herein as an example). The contact layer 13 and the signal layer 12f are electrically isolated by one or more dielectric layer 14f positioned between the contact layer 13 and the signal layer 12f. In some embodiments, the contact layer 13 and the signal layer 12f are electrically connected to the barrel 18. In these embodiments, once the contact layer 13 is disconnected from the barrel 13 as discussed herein, the contact layer and the signal layer 12f are electrically isolated. The depth or thickness of dielectric layer 14f represents the known distance between the signal layer 12f and the contact layer 13 and is subject to variations referred to as dielectric layer tolerances. These dielectric layer tolerances must be taken into account during the back-drilling process as will be described further herein.

In some embodiments, the contact layer 13 may be an antipad on a power/ground plane that is removed during the back-drilling process described herein. In some embodiments, the contact layer 13 may be a signal layer, however, signal layers are expensive real estate in the plated multi-layer circuit boards 10 and typically have no space in the dense areas where the back-drilling described herein would typically be performed. As will be described in more detail herein, the contact layer 13 positioned on a back-drilling side of the signal layer 12f creates a reference for the boring device 4 to detect.

The boring device 4 is provided with a spindle unit 30 supporting a cutting device 32 and a measurement unit 34. The boring device 4 may be a drill, CNC milling machine, or router, for instance. The cutting device 32 may be a drill bit, an end mill, or the like that is constructed of an electrically conductive material. The cutting device 32 is provided having a diameter 33. The diameter 33 of the cutting device 32 is greater than the outside diameter 19 of the barrel 18. This ensures removal of all of the electrically conductive material of the barrel 18 when the plated multi-layer circuit board 10 is drilled.

The measurement unit 34 is electrically connected to the plated multi-layer circuit board 10 and with the spindle unit 30 and/or the cutting device 32 via a wire 36 or the like to sense contact or proximity between the cutting device 32 and the plated multi-layer circuit board 10. Note that in some embodiments the plated multi-layer circuit board 10 is fully plated and can be contacted by the wire 36 on any position. As soon as the cutting device 32 contacts the electrically conductive material of signal layer 12a, the plated multi-layer circuit board 10 is detected by the boring device 4 and a pre-programmed action can be performed. For instance, the pre-programmed action could be to set a first zero stop position, to stop and retract, to continue drilling for a set depth and then retract, or combinations thereof.

In FIGS. 2-9, the boring device 4 is not illustrated in its entirety. However, a person of skill in the art will recognize that the cutting device 32 illustrated is part of and connected to the boring device 4 as described above to perform the methods and steps described herein. Further, the backdrilling process described below can be applied for each barrel 18 within the plated multi-layer circuit board 10 that has a stub portion intended to be removed. In this case, when the stub portion has been removed for a particular barrel 18, the spindle unit 30 and the cutting device 32 can be retracted and moved laterally relative to the plated multi-layer circuit board 10 to align a longitudinal axis of the cutting device 32 with another barrel 18. Either the spindle unit 30, the cutting device 32 and/or the plated multi-layer circuit board 10 can be moved laterally to align the longitudinal axis of the cutting device 32 with a center point within the barrel 18. Once the longitudinal axis of the cutting device 32 is aligned with the center point within the barrel 18, the backdrilling process can be repeated.

Figure 2:
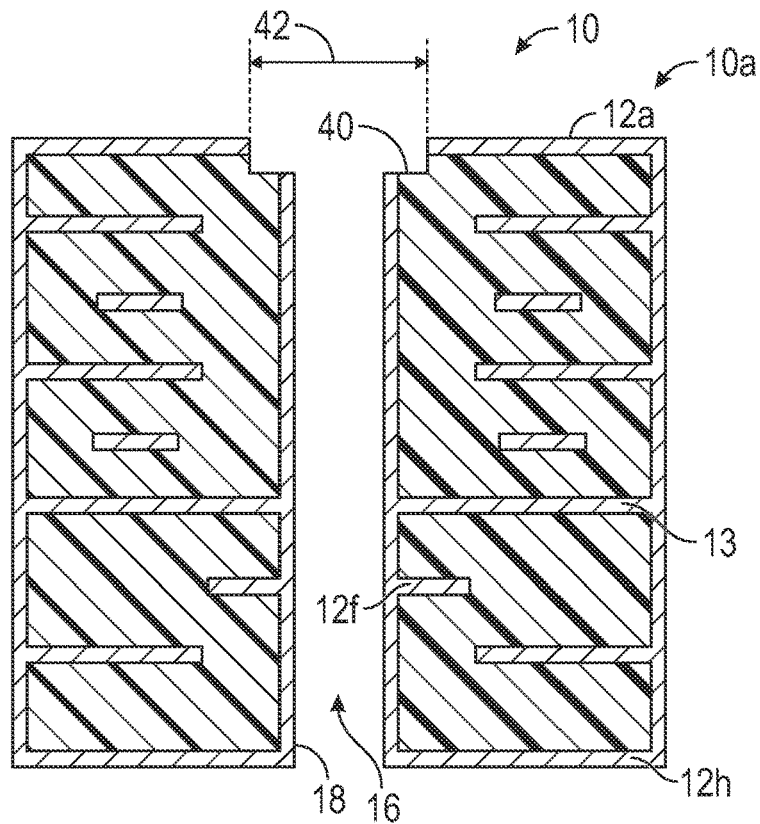
FIG. 2 is a cross-sectional view of the multi-layer circuit board of FIG. 1 with a first bore extending through a signal layer of the plated multi-layer circuit board in accordance with one embodiment of the present disclosure.
Figure 3:
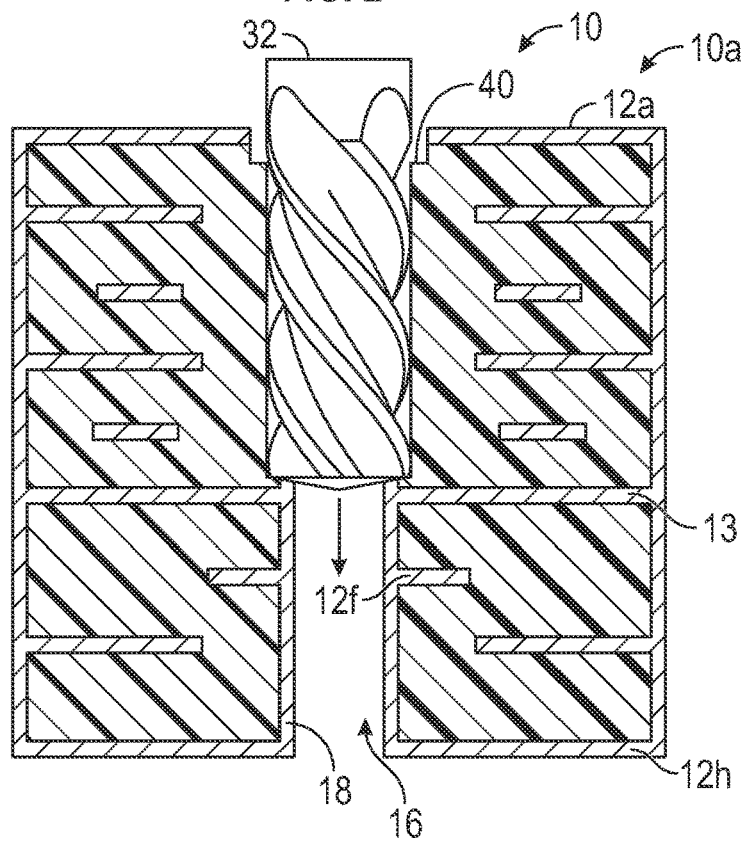
FIG. 3 is a cross-sectional view of the multi-layer circuit board of FIG. 1 showing a cutting device drilling a second bore which extends through multiple layers of the plated multi-layer circuit board in accordance with one embodiment of the present disclosure.
Figure 4:
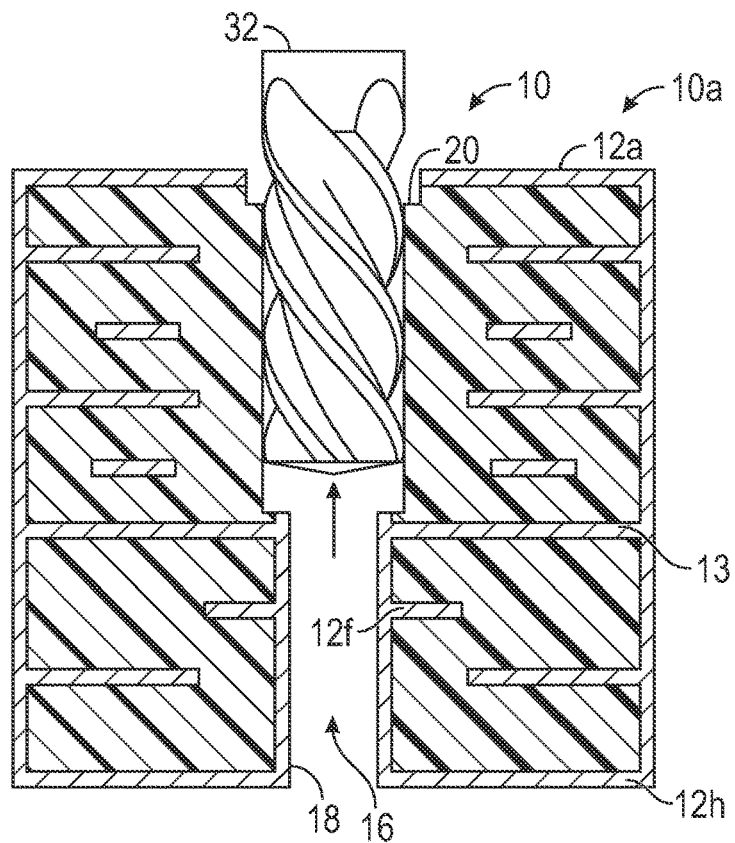
FIG. 4 is a cross sectional view of the multi-layer circuit board of FIG. 3 showing the cutting device backed out of the second bore so the cutting device is no longer in contact with a barrel comprised of an electrically conductive material in accordance with one embodiment of the present disclosure.
Figure 5:
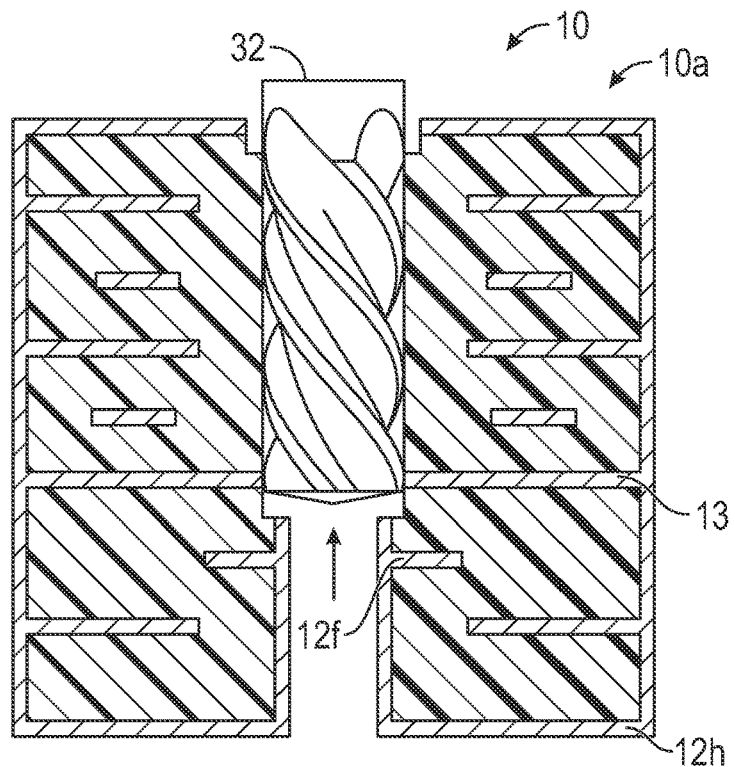
FIG. 5 is a cross sectional view of the multi-layer circuit board of FIG. 4 showing the cutting device backed out of the second bore so the cutting device is no longer in contact with a barrel but still in contact with a contact layer in accordance with one embodiment of the present disclosure.

A portion of the barrel 18 is electrically isolated from the signal layer 12a by removing a portion of signal layer 12a as seen in FIG. 2. This may be done by creating a bore 40 through the signal layer 12a extending partially into dielectric layer 14a. The bore 40 removes the electrically conductive material of the signal layer 12a and a portion of the barrel 18. The bore 40, has a diameter 42 that is greater than the diameter 33 of the cutting device 32. In some embodiments, the diameter 42 is 0.05 mm to 0.2 mm larger than the diameter 33 of the cutting device 32. However, it should be noted that these measurements are provided as an example only and the bore 40 could have any diameter 42 that is larger than the diameter 33 of the cutting device 32 such that the diameter of electrically conductive material of signal layer 12a that is removed ensures that the cutting device 32 will not contact the electrically conductive material of signal layer 12a. The bore 40 may be cut using a cutting device (not shown) that is similar to cutting device 32, for instance, which can remove the electrically conductive material of signal layer 12a and a portion of the underlying dielectric layer 14a. In some embodiments, the electrically conductive material of signal layer 12a may be removed using techniques such as etching, laser ablation, milling, etc.

A depth of the back-drilling of the plated multi-layer circuit board 10 depends upon where the contact layer 13 is positioned relative to the signal layer 12f in the cross section of the plated multi-layer circuit board 10. The goal is to ensure that any stub portion that remains is as short as possible and as constant as possible across production of multiple plated multi-layer circuit boards 10. In other words, there will be minimum variation between produced plated multi-layer circuit boards 10 in a batch as well as between different batches.

To find a depth of the contact layer 13 in the plated multi-layer circuit boards 10, a progressive reciprocating drilling technique is used with electrical sensing. The progressive reciprocating drilling technique is accomplished by lowering or extending the cutting device 32 into the aperture 16 and sensing an electrical potential on the barrel 18 and/or the contact layer 13 through the cutting device 32. Once the boring system 4 senses the cutting device 32 contact with the barrel 18, the boring system 4 lowers or extends the cutting device 32 a predetermined distance. Once the cutting device 32 reaches the predetermined distance, the cutting device 32 is retracted a predetermined distance cutting contact between the cutting device 32 and the barrel 18 (shown in FIG. 4) which is sensed by the boring device 4. This cycle, starting from the previous depth, is repeated and another predetermined distance of the barrel 18 is removed. This process is repeated until contact is not broken when the cutting device 32 is retracted indicating that the cutting device 32 is contacting the contact layer 13 (shown in FIG. 5). The predetermined retraction distance determines the depth accuracy once the contact layer 13 is found.

With the cutting device 32 at the contact layer 13, the boring system 4 references the depth and determines a distance for the next cut. The boring system 4 takes the known depth or thickness of dielectric layer 14f, taking into account the dielectric layer tolerances, to determine the distance for the next cut. The next cut ensures that the contact layer 13 is electrically isolated from the signal layer 12f. Any barrel 18 left above the signal layer 12f after the next cut is referred to as a stub 50 (shown in FIG. 6) which has a stub length 52. As described above, the greater the stub length 52 the greater the interference. Thus, to enhance the signal to noise ratio in electronic systems that utilize high-speed signals it may be desirable to make one or more other cuts to get closer to the signal layer 12f which will reduce the stub length 52.

Using the methods described herein, it is possible to reduce the stub length 52 because the contact layer 13 acts as a reference or second zero point. Using this second zero point, only the layer tolerances between the contact layer 13 and the signal layer 12f must be taken into account when determining a final depth to be drilled. For instance, in the example illustrated in FIGS. 1-6, there is only one dielectric layer 14f between the contact layer 13 and the signal layer 12f. Therefore, only one set of dielectric layer tolerances must be taken into account when determining the final depth to be drilled allowing the stub length 52 to be small.

By comparison, when done using prior art methods, layer tolerances of six signal layers (signal layers 12a-12e and contact layer 13 which would be a signal layer in such a scenario) as well as dielectric layer tolerances of six dielectric layers (14a-14f) would have to be taken into account making it more likely that 1) a stub depth would be longer; or 2) increasing the chances that the signal layer 12f would be damaged or cut during drilling.

It should be noted that when designing a multi-layer circuit board, the designer may choose a contact layer that is spaced further apart from the desired signal layer so long as a safe isolation is created. In this context, the term safe isolation refers to a minimum distance between a stub and a contact layer that forms a large enough barrier to not cause a CAF/EM failure. However, the contact layer should not be too far away from the desired signal layer in case a sliver is formed so that the sliver can be detected using the methods that will be described below.

Figure 7:
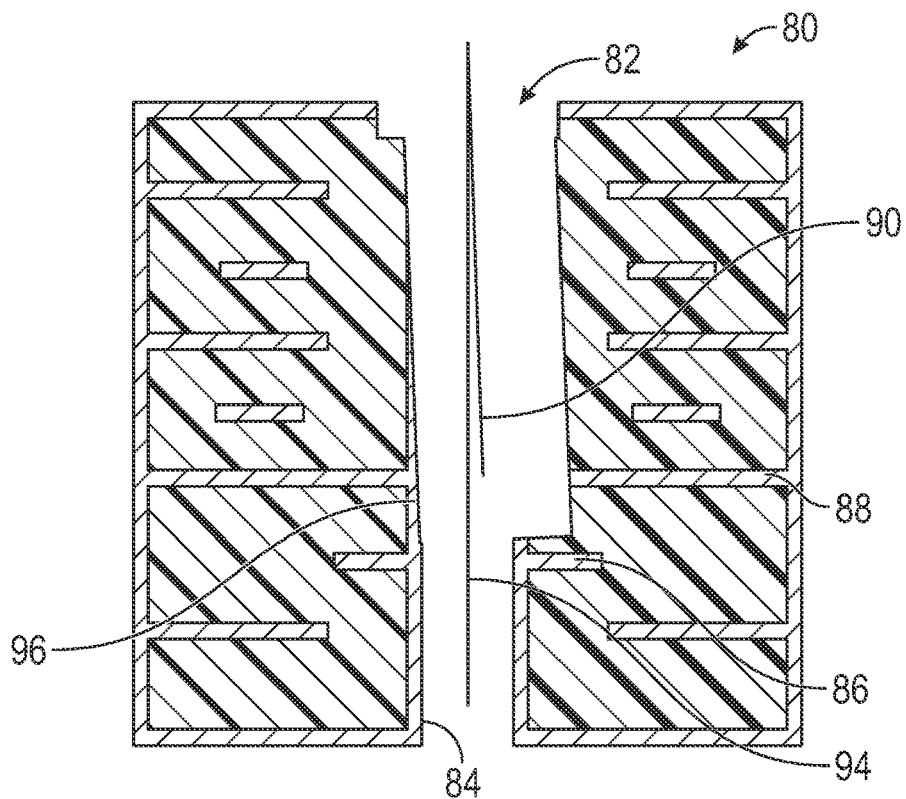
FIG. 7 is a cross sectional view of a plated multi-layer circuit board having a sliver formed in a barrel in accordance with one embodiment of the present disclosure.
Figure 8:
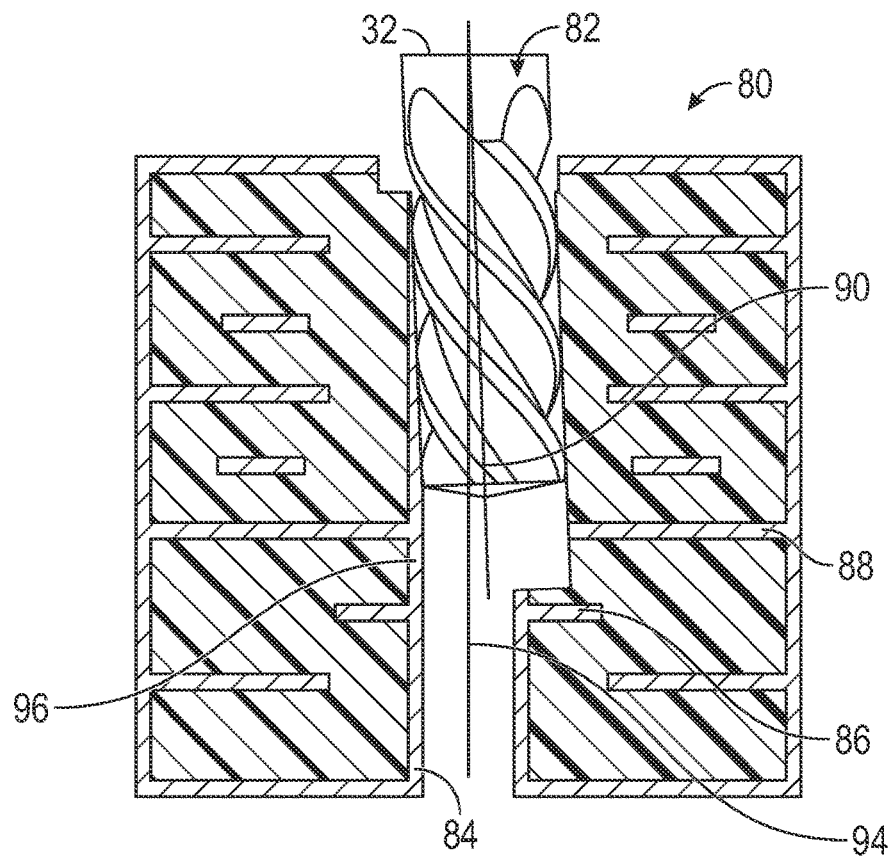
FIG. 8 is a cross sectional view of the plated multi-layer circuit board of FIG. 7 with a cutting device partially retracted and in contact with the sliver formed in the barrel in accordance with one embodiment of the present disclosure.

Referring now to FIGS. 7-8, shown is a multi-layer circuit board 80 wherein a bore 82 has been formed as described above to remove a portion of a barrel 84 to a minimum distance with reference to a desired signal layer 86. However, in this case an axis 90 of the bore 82 was not aligned or coaxial with an axis 94 of the barrel 84. This misalignment caused the formation of a sliver 96 in the electrically conductive material of the barrel 84. As part of the sliver 96 is in contact with the signal layer 86, the sliver 96 creates signal dispersion that must be eliminated.

The sliver 96 could be also be created/formed due to wandering of the cutting device 32, deflection of the cutting device 32, or wandering of the spindle unit 30, for instance.

There are three methods to detect the conductive sliver 96 using the inventive concepts disclosed herein. First, the sliver 96 can short the contact layer 88 and signal layer 86 after the bore 82 has been drilled to a depth known or expected to have passed the contact layer 88 as illustrated in FIG. 7.

Second, as illustrated in FIG. 8 when the cutting device 32 is retracted above the contact layer 88 and the circuit is still closed, this indicates the presence of the sliver 96. The depth of the contact layer 88 can be stored in the boring system 4 for statistical analysis to determine a depth at which the contact layer 88 should have been reached or at a retraction depth at which there should no longer be contact, for instance.

Figures 9A, 9B:
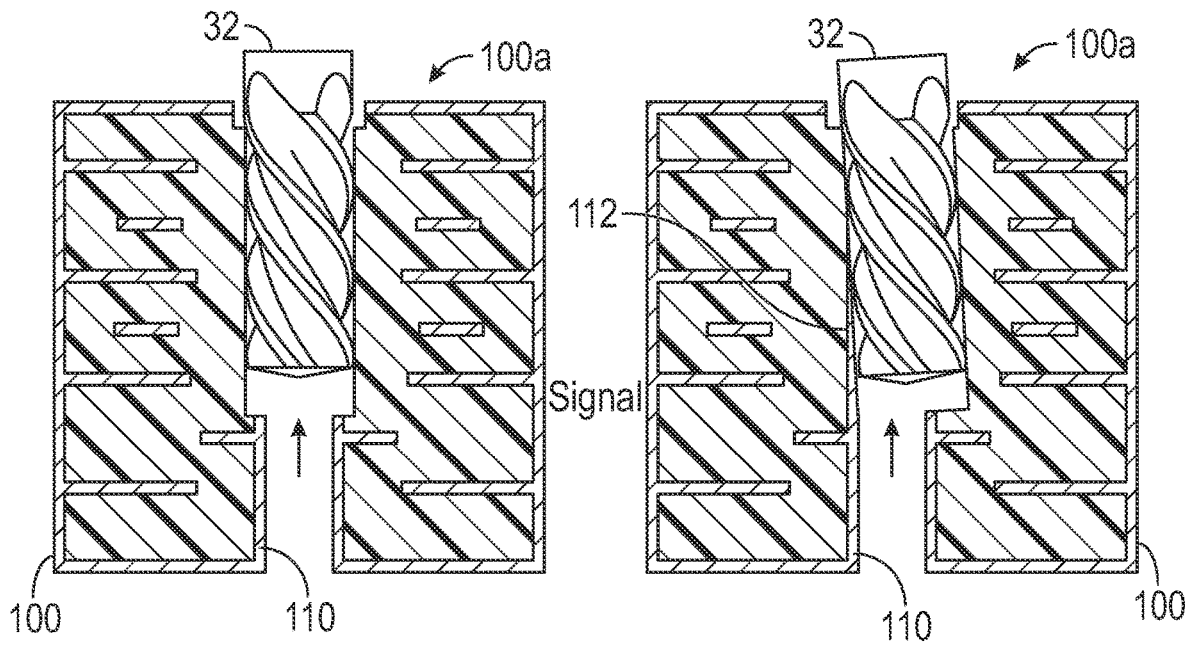
FIG. 9A is a cross sectional view of a multi-layer circuit board with a cutting device partially retracted so the cutting device is not in contact with a barrel in accordance with one embodiment of the present disclosure.
FIG. 9B is a cross sectional view of a multi-layer circuit board with a cutting device partially retracted but in contact with a sliver formed in a barrel in accordance with one embodiment of the present disclosure.

FIGS. 9A and 9B show a multi-layer circuit board 100a constructed similar to the multi-layer circuit board 10a described above with the exception that the multi-layer circuit board 100a is constructed without a contact layer.

The bore system 4 may be used as described above. Therefore, in the interest or brevity, the bore system 4 will be described with reference to the FIGS. 9A and 9B. The bore system 4 reciprocally drills the plated multi-layer circuit board 100 as described above. Each time the cutting device 32 is retracted, an open circuit should be formed between a barrel 110 and cutting device 32 as illustrated in FIG. 9A. In the case where a sliver 112 is formed in the barrel 110, there is a continuity measured when the cutting device 32 is retracted indicating the presence of the sliver 112. The measurement at retracting can be performed at multiple locations over the full length of the back-drilled portion.

Figure 10A:
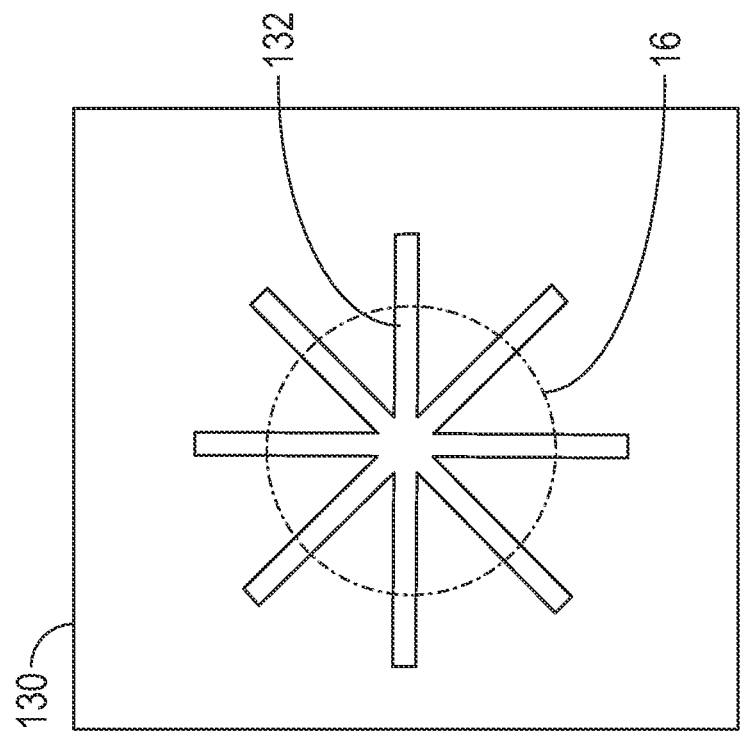
FIGS. 10A and 10B show top plan views of contact pads having a one or more electrically conductive fingers constructed in accordance with embodiments of the present disclosure.
Figure 10B:
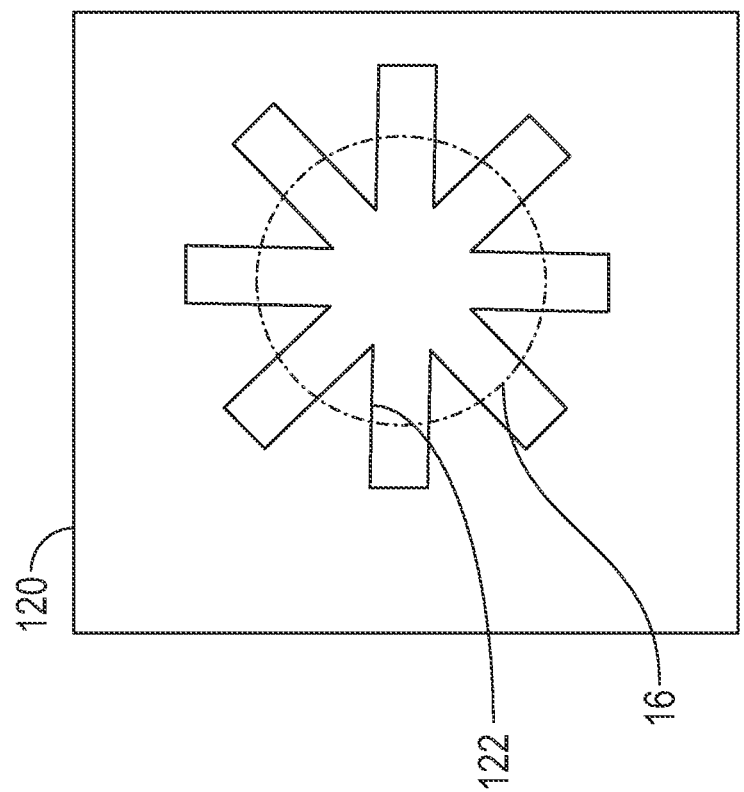

Referring now to FIGS. 10A and 10B, shown are contact pads 120 and 130. The contact pads 120 and 130 may be formed in the contact layers 13 and 88 described above aligned with the aperture 16, for instance. When the contact layers 13 and 88 are formed of a solid electrically conductive material such as copper, a capacitance of the signal layers 12f and 86 is increased. Increasing a distance between the contact layers 13 and 88 and the signal layers 12f and 86 will decrease the capacitance but will also reduce the accuracy with which the stub length can be determined as explained above. To reduce the capacitance, the contact pads 120 and 130 having one or more electrically conductive fingers 122 and 132 (only one of which is labeled in each of FIGS. 10A and 10B) may be formed in the contact layers 13 and 88. The reduced surface area of the contact pads 120 and/or 130 reduces the capacitance between the contact layers 13 and 88 and the signal layers 12f and 86 allowing the signal layer 12f or 86, and the contact layer 13 or 88 to be spaced closer together.

From the above description, it is clear that the inventive concept(s) disclosed herein are well adapted to carry out the objects and to attain the advantages mentioned herein, as well as those inherent in the inventive concept(s) disclosed herein. While the embodiments of the inventive concept(s) disclosed herein have been described for purposes of this disclosure, it will be understood that numerous changes may be made and readily suggested to those skilled in the art which are accomplished within the scope and spirit of the inventive concept(s) disclosed herein.

What is claimed is:

1. A method, comprising:
   electrically connecting a boring device having a cutting device with a barrel of an aperture of a plated multi-layered circuit board, the barrel of the aperture comprising an electrically conductive material, the cutting device having a diameter larger than an outer diameter of the barrel;
   extending the cutting device until contact with the barrel of the plated multi-layered circuit board is sensed by sensing a closed circuit between the cutting device and the barrel;
   progressively reciprocating the cutting device a plurality of times, with each reciprocation extending the cutting device a first predetermined distance into the barrel to form a bore and retracting the cutting device a second predetermined distance to a retracted position within the bore, wherein the second predetermined distance is less than the first predetermined distance; and
   while in the retracted position, determining a sliver of the barrel remains within the first predetermined distance, by sensing electrical contact indicating a closed circuit between the cutting device and the sliver of the barrel of the plated multi-layered circuit board.

2. The method of claim 1, wherein the plated multi-layered circuit board has a first layer formed of a conductive material electrically connected with the barrel, and further comprising the step of disconnecting the barrel from the conductive material.

3. The method of claim 2, wherein the bore is a second bore and the cutting device is a first cutting device and wherein disconnecting the barrel from the conductive material is defined further as extending a second cutting device a third predetermined distance through the first layer of the plated multi-layered circuit board to form a first bore, the first bore being larger than the second bore.

4. The method of claim 1, wherein sensing electrical contact indicating a closed circuit between the cutting device and the barrel of the plated multi-layered circuit board is performed at multiple locations.

* * * * *